(12) United States Patent
Takeshi

(10) Patent No.: US 8,409,451 B2
(45) Date of Patent: Apr. 2, 2013

(54) APPARATUS FOR ETCHING SUBSTRATE AND METHOD OF FABRICATING THIN-GLASS SUBSTRATE

(75) Inventor: Kazushige Takeshi, Tokyo (JP)

(73) Assignee: NEC Corporation, Tokyo (JP)

( * ) Notice: Subject to any disclaimer, the term of this patent is extended or adjusted under 35 U.S.C. 154(b) by 116 days.

(21) Appl. No.: 12/881,343

(22) Filed: Sep. 14, 2010

(65) Prior Publication Data

US 2010/0326953 A1 Dec. 30, 2010

Related U.S. Application Data

(62) Division of application No. 11/824,739, filed on Jul. 2, 2007, now Pat. No. 7,823,595.

(30) Foreign Application Priority Data

Jul. 4, 2006 (JP) ................................. 2006-184351

(51) Int. Cl.
*H01B 13/00* (2006.01)
(52) U.S. Cl. ................. 216/13; 216/36; 216/92; 216/93
(58) Field of Classification Search .................. None
See application file for complete search history.

(56) References Cited

U.S. PATENT DOCUMENTS

| | | | |
|---|---|---|---|
| 7,998,787 B2* | 8/2011 | Seo et al. ........................ | 438/99 |
| 8,071,422 B2* | 12/2011 | Seo et al. ........................ | 438/99 |
| 2005/0016929 A1 | 1/2005 | Kashkoush | |
| 2005/0020463 A1* | 1/2005 | Ikemoto et al. ............... | 510/175 |
| 2006/0176417 A1* | 8/2006 | Wu et al. ........................ | 349/58 |
| 2006/0226441 A1* | 10/2006 | Seo et al. ....................... | 257/190 |
| 2007/0051306 A1 | 3/2007 | Ivanov et al. | |
| 2007/0116948 A1* | 5/2007 | Kim et al. ...................... | 428/343 |
| 2007/0155045 A1* | 7/2007 | Seo et al. ........................ | 438/99 |
| 2007/0295357 A1 | 12/2007 | Lovejoy et al. | |
| 2008/0299859 A1* | 12/2008 | Paolini et al. ................... | 445/23 |
| 2010/0326953 A1* | 12/2010 | Takechi ........................... | 216/13 |

FOREIGN PATENT DOCUMENTS

| | | |
|---|---|---|
| JP | 58-36949 | 3/1983 |
| JP | 4-116619 | 4/1992 |
| JP | 08-160403 | 6/1996 |
| JP | 9-159409 | 6/1997 |
| JP | 2722798 | 11/1997 |
| JP | 10-268247 | 10/1998 |
| JP | 11-44877 | 2/1999 |
| JP | 11-271739 | 10/1999 |
| JP | 11-307494 | 11/1999 |

(Continued)

OTHER PUBLICATIONS

English translation of JP2005-298314, translated on Jun. 11, 2012, pp. 1-15.*

(Continued)

*Primary Examiner* — David E Graybill
(74) *Attorney, Agent, or Firm* — Scully, Scott, Murphy & Presser PC

(57) ABSTRACT

An apparatus for etching a substrate includes (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

9 Claims, 9 Drawing Sheets

FOREIGN PATENT DOCUMENTS

| | | | |
|---|---|---|---|
| JP | 2002-184959 | | 6/2002 |
| JP | 2002-341791 | | 11/2002 |
| JP | 2003-20255 | | 1/2003 |
| JP | 2003-307751 | | 10/2003 |
| JP | 2003-316281 | | 11/2003 |
| JP | 2003-323132 | | 11/2003 |
| JP | 2004186042 A | * | 7/2004 |
| JP | 2004186043 A | * | 7/2004 |
| JP | 2004186044 A | * | 7/2004 |
| JP | 2004-219551 | | 8/2004 |
| JP | 2004-335927 | | 11/2004 |
| JP | 2004-363200 | | 12/2004 |
| JP | 2005-019054 | | 1/2005 |
| JP | 2005-099410 | | 4/2005 |
| JP | 2005-247687 | | 9/2005 |
| JP | 2005-298314 | | 10/2005 |
| JP | 2005298314 A | * | 10/2005 |
| JP | 2006-018217 | | 1/2006 |
| JP | 2006-047362 | | 2/2006 |
| JP | 2006-121031 | | 5/2006 |
| JP | 2006133751 A | * | 5/2006 |
| JP | 2006243754 A | * | 9/2006 |

OTHER PUBLICATIONS

English translation of JP2006-018217, translated on Jun. 13, 2012, pp. 1-20.*
Japanese Official Action mailed Oct. 11, 2011 in related Japanese Patent Application No. 2009-153608.
Japanese Official Action dated Sep. 14, 2011 in related Japanese Patent Office application, 2006-184351.
Takeuchi, K.; "High-Rate Glass Etching Process for Transferring Polycrystalline Silicon Thin-Film Transistors to Flexible Substrates", IEEE Transactions on Semiconductor Manufacturing, vol. 18, No. 3, 2005, pp. 384-389.

* cited by examiner

GATE VOLTAGE (V)
Vd : DRAIN VOLTAGE   L : CHANNEL LENGTH

APPARATUS FOR ETCHING SUBSTRATE AND METHOD OF FABRICATING THIN-GLASS SUBSTRATE

CROSS REFERENCE TO RELATED APPLICATION

The present application is a divisional application of U.S. patent application Ser. No. 11/824,739 dated Jul. 2, 2007, the entire contents of which is incorporated herein by reference.

BACKGROUND OF THE INVENTION

1. Field of the Invention

The invention relates to an apparatus for etching a substrate, a method of fabricating a thin-glass substrate, a method of fabricating a TFT (thin film transistor) array substrate, and a method of fabricating a device.

2. Description of the Related Art

A thin film device such as a thin film transistor (TFT) is usually fabricated on an electrically insulating substrate. If a thin film device is to be used for a display device such as a liquid crystal display device, it is usually fabricated on a transparent glass substrate.

In these days, a display device is required to be light, thin and flexible. To this end, a technique for fabricating a thin film device on a resin substrate is developed.

A thin film device can be fabricated on a resin substrate by either a first process in which a thin film device is fabricated directly on a resin substrate at a low temperature to which the resin substrate has a resistance, or a second process including steps of fabricating a thin film device on a glass substrate in a conventional manner, and transferring the thin film device onto a resin substrate.

With respect to the above-mentioned second process, many processes have been suggested as follows.

For instance, there has been suggested a process including steps of fabricating a thin film transistor array on a glass substrate, immersing the glass substrate into hydrofluoric acid solution, supplying vortexes of hydrofluoric acid solution to the glass substrate to thereby etch the glass substrate, and transferring the thin film transistor array onto a resin substrate, in K. Takeuchi, T. Eguchi, H. Kanoh, T, Ito, and S. Otsuki, "High-rate glass etching process for transferring polycrystalline silicon thin-film transistors to flexible substrates", IEEE Transactions on Semiconductor Manufacturing, Vol. 18, No. 3, 2005, pp. 384-389.

Japanese Patent Application Publication No. 4-116619 (published on April 1992) has suggested a process including steps of adhering a pair of glass substrates to each other on each of which a liquid crystal display device has been already fabricated, and immersing the glass substrates into hydrofluoric acid solution for etching the glass substrates.

Japanese Patent Application Publication No. 2003-323132 has suggested a process including steps of forming a molybdenum film as an etching stopper on a glass substrate, fabricating a thin film transistor array on the glass substrate, and immersing the glass substrates into hydrofluoric acid solution for etching the glass substrates.

The above-mentioned Publications do not describe in detail etching a glass substrate through the use of hydrofluoric acid solution.

However, Japanese Patent Application Publication No. 2003-323132 describes that it takes about 3.5 hours for etching a glass substrate, in which case, an estimated etching rate is about 3 micrometers per a minute.

The above-mentioned IEEE Transactions on Semiconductor Manufacturing describes that if an etching rate is increased by increasing a concentration of hydrofluoric acid in the solution, specifically, if an etching rate is increased to 6 micrometers or more per a minute by doing the same, minute particles insoluble to hydrofluoric acid solution are likely to adhere to a surface of the glass substrate, resulting in that etching uniformity is deteriorated.

In the above-mentioned related art in which a glass substrate is immersed into hydrofluoric acid solution to thereby etch the glass substrate, it was not possible to uniformly etch a glass substrate at a high etching rate. The related art takes more than two hours to etch a glass substrate, causing a problem that a through-put is quite slow as mass-production technique.

Japanese Patent No. 2722798, corresponding to Japanese Patent Application Publication No. 4-116619 published on April 1992, has suggested a method of fabricating a thin liquid crystal display device, including adhering a pair of glass substrates to each other with sealing material being sandwiched therebetween, and etching the glass substrates through lower surfaces thereof to thin the glass substrates.

Japanese Patent Application Publication No. 9-159409 (published on June 1997) has suggested an apparatus for detecting when surface treatment is finished. When an etchant is supplied onto a surface of a substrate for removing a layer formed on the surface of the substrate, the apparatus forms a fluid curtain in an area formed between the surface of the substrate and a measurement plane disposed facing the surface of the substrate. The fluid curtain is composed of the same fluid as the etchant. The apparatus includes an elevator system which contact a measurement window to the surface of the substrate or separates the measurement window from the surface of the substrate, an optical detector for measuring a distance between the measurement window and the surface of the substrate, and a fluid curtain controller which controls the elevator system such that the distance between the measurement window and the surface of the substrate is equal to a standard distance, based on the distance between the measurement window and the surface of the substrate.

Japanese Patent Application Publication No. 10-268247 (published on October 1998) has suggested a method of fabricating a liquid crystal panel, including adhering a first glass substrate and a second glass substrate to each other, introducing liquid crystal into a gap formed between the first and second glass substrates, and etching the first and second glass substrates through surfaces thereof opposite to surfaces thereof through which the first and second glass substrates are adhered to each other.

Japanese Patent Application Publication No. 11-44877 (published on February 1999) has suggested an apparatus for washing a substrate, including a first unit which sprays washing solution to upper and lower surfaces of a glass substrate fed in a single direction, a second unit which sprays pure water to the upper and lower surfaces of a glass substrate for flushing the washing solution, and a third unit for drying the glass substrate. Each of the first and second units is designed to include a plurality of nozzles inclining relative to the direction in which substrates are fed, and a plurality of shower pipes arranged crossing the direction, each having a central portion extending towards the direction, and opposite ends inclining relative to the direction.

Japanese Patent Application Publication No. 2004-363200 (published on December 2004) has suggested a method of etching a substrate, including coating an etchant onto a substrate, and feeding the substrate on a plurality of feeding rollers arranged in parallel with one another. The feeding rollers are kept at the same temperature as a temperature of the etchant.

Japanese Patent Application Publication No. 2005-247687 (published on September 2005) has suggested a method of etching a glass substrate, including immersing a glass substrate into chemical solution, and exchanging the chemical solution to new one before quality of the chemical solution is degraded. The glass substrate is etched at a rate equal to or smaller than 10 micrometers per a minute.

Japanese Patent Application Publication No. 2006-121031 (published on May 2006) has suggested an apparatus for processing a substrate, including a processor which processes a substrate with processing solution, an exhaust pipe through which the processing solution is exhausted out of the processor, a filter arranged in the exhaust pipe, and a ultraviolet ray irradiator which irradiates ultraviolet rays to the processing solution during the processing solution passes through the filter.

SUMMARY OF THE INVENTION

In view of the above-mentioned problem in the related art, it is an exemplary object of the present invention to provide an apparatus for etching a substrate which is capable of effectively preventing minute particles from attaching to a surface of a substrate, and accomplishing a high etching rate.

It is also an exemplary object of the present invention to provide a method of fabricating a thin-glass substrate, a method of fabricating a TFT (thin film transistor) array substrate, and a method of fabricating a device, all of which are capable of doing the same.

In a first exemplary aspect of the present invention, there is provided an apparatus for etching a substrate, including (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

There is further provided an apparatus for etching a substrate, including (a) a first unit for spraying acid solution containing at least hydrofluoric acid onto the substrate, (b) a second unit for moving at least one of the first unit and the substrate relative to the other in a predetermined direction in such a condition that the substrate and the first unit face each other, (c) a third unit for filtering off particles out of the acid solution having been sprayed onto the substrate, and (d) a fourth unit for circulating the acid solution having been sprayed onto the substrate, to the third unit, and further, to the first unit from the third unit.

In a second exemplary aspect of the present invention, there is provided a method of fabricating a thin-glass substrate, including preparing an apparatus for etching a substrate, and etching a glass substrate containing silicon dioxide as a principal constituent at an etching rate equal to or higher than 2 micrometers per a minute by means of the apparatus, wherein the apparatus includes (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

In a third exemplary aspect of the present invention, there is provided a method of fabricating a TFT array substrate, including (A) adhering a protection film onto an upper surface of a glass substrate on which a thin film transistor (TFT) array has been fabricated, and (B) etching the glass substrate through a lower surface thereof such that the glass substrate has a thickness greater than 0 micrometer, but equal to or smaller than 200 micrometers, the step (B) including preparing an apparatus for etching a substrate, and etching the glass substrate containing silicon dioxide as a principal constituent at an etching rate equal to or higher than 2 micrometers per a minute by means of the apparatus, wherein the apparatus includes (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

There is further provided a method of fabricating a TFT array substrate, including (A) adhering a protection film onto an upper surface of a glass substrate on which an etching stopper film having an etching rate five times or more slower than an etching rate of glass to hydrofluoric acid, and a thin film transistor array have been formed in this order, and (B) etching the glass substrate through a lower surface thereof to entirely remove the glass substrate, the step (B) including preparing an apparatus for etching a substrate, and etching the glass substrate containing silicon dioxide as a principal constituent at an etching rate equal to or higher than 2 micrometers per a minute by means of the apparatus, wherein the apparatus includes (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

In a fourth exemplary aspect of the present invention, there is provided a method of fabricating a device, including (A) fabricating a device by adhering a pair of glass substrates to each other, a thin film device having been fabricated on each of upper surfaces of the glass substrates, the glass substrates being adhered to each other such that the upper surfaces face each other, and (B) etching the glass substrates through lower surfaces thereof, the step (B) including preparing an apparatus for etching a substrate, and etching the glass substrate containing silicon dioxide as a principal constituent at an etching rate equal to or higher than 2 micrometers per a minute by means of the apparatus, wherein the apparatus includes (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

There is further provided a method of fabricating a device, including (A) fabricating a device by adhering a glass substrate and a flexible substrate to each other, a thin film device has been already fabricated on each of upper surfaces of the glass substrate and the flexible substrate, the glass substrate and the flexible substrate being adhered to each other such that the upper surfaces face each other, and (B) etching the glass substrate and the flexible substrate through lower surfaces thereof, the step (B) including preparing an apparatus for etching a substrate, and etching the glass substrate containing silicon dioxide as a principal constituent at an etching rate equal to or higher than 2 micrometers per a minute by means of the apparatus, wherein the apparatus includes (a) a nozzle system including at least one nozzle through which acid solution containing at least hydrofluoric acid is sprayed onto the substrate, (b) a mover which moves at least one of the nozzle system and the substrate relative to the other in a predetermined direction in such a condition that the substrate and the nozzle system face each other, (c) a filter system which filters off particles out of the acid solution having been sprayed onto the substrate, and (d) a circulation system which circulates the acid solution having been sprayed onto the substrate, to the filter system, and further, to the nozzle system from the filter system.

The above and other objects and advantageous features of the present invention will be made apparent from the following description made with reference to the accompanying drawings, in which like reference characters designate the same or similar parts throughout the drawings.

DESCRIPTION OF THE EXEMPLARY EMBODIMENTS

Exemplary embodiments in accordance with the present invention will be explained hereinbelow with reference to drawings.

[First Exemplary Embodiment]

Figure 1:
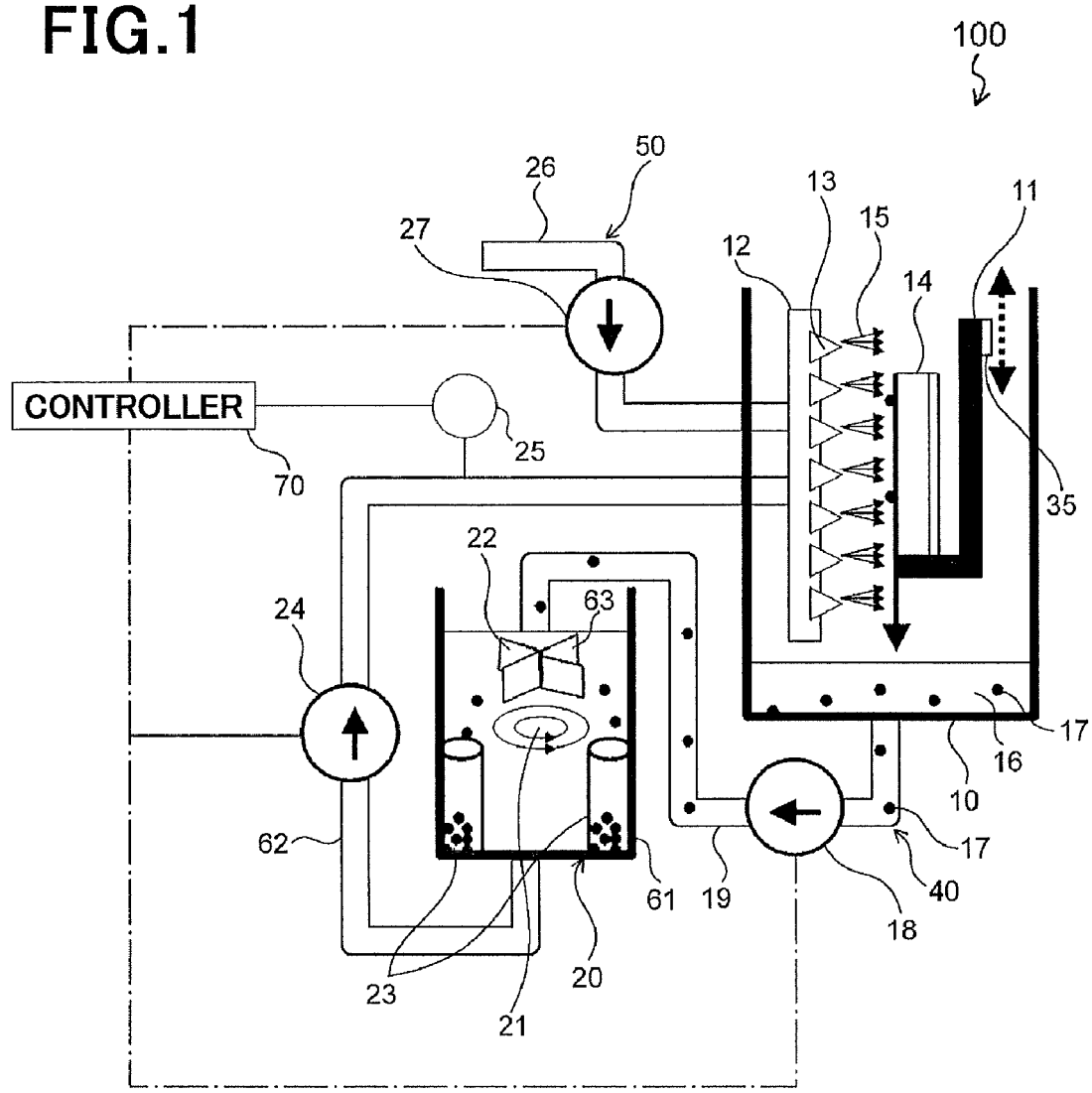
FIG. 1 illustrates an etching apparatus for etching a substrate, in accordance with the first exemplary embodiment.

FIG. 1 illustrates an etching apparatus 100 for etching a substrate, in accordance with the first exemplary embodiment.

As illustrated in FIG. 1, the etching apparatus 100 is comprised of an etching bath 10 in which a substrate 14 is etched, a substrate holder 11 holding the substrate 14 in the etching bath 10, a nozzle system 12 which sprays acid solution 16 to the substrate 14 held by the substrate holder 11, a mover 35 which moves the substrate holder 11 relative to the substrate 14, a filter system 20 which removes impurities out of the acid solution before the acid solution is supplied again to the nozzle system 12 after the acid solution was sprayed onto the substrate 14, a circulation system 40 which supplies the acid solution contained in the etching bath 10 after having been sprayed onto the substrate 14, again to the nozzle system 12 through the filter system 20, and a water supply system 50 which supplies water to the nozzle system 12.

The etching apparatus 100 further includes a water conduit 26, a circulation pump 27 which supplies water to the nozzle system 12 through the water conduit 26, a fluid-pressure meter 25 which measuring a pressure of the acid solution 16 passing through a later-mentioned second conduit 62, and a controller 70 which receives a signal indicative of a pressure of the acid solution 16 from the fluid-pressure meter 25, and further, controls operation of the first pump 18, the second pump 24 and the circulation pump 27.

For instance, the substrate 14 to be etched by the etching apparatus 100 is in a planar form.

The acid solution 16 contains at least hydrofluoric acid.

The substrate holder 11 is moved by the mover 35 in such a condition as holding the substrate 14 to be etched. For instance, the substrate holder 11 is vertically or horizontally moved, or rotated by the mover 35. As an alternative, the substrate holder 11 may be vertically or horizontally moved during being rotated. When the substrate holder 11 is vertically or horizontally moved by the mover 35, the substrate holder 11 is vertically or horizontally reciprocated.

That is, the mover 35 is designed to be able to move the substrate 14 relative to the nozzle system 12 in a desired direction, keeping the substrate 14 and the nozzle system 12 facing each other, during the substrate 14 is being etched.

The nozzle system 12 includes a plurality of nozzles 13 arranged in a plane.

The nozzles 13 are directed towards the substrate 14 held by the substrate holder 11, and designed to be able to spray either the acid solution 16 or water in the form of a shower 15 onto a surface of the substrate 14 held by the substrate holder 11.

As an alternative, the nozzles 13 may be designed to spray the acid solution 16 or water in the form of mist onto the substrate 14.

The substrate holder 11 holds the substrate 14 so as not to exist between the nozzles 13 and the substrate 14.

The acid solution 16 having been sprayed onto a surface of the substrate 14 through the nozzles 13 drops off a surface of the substrate 14, and then, is collected in the etching bath 10.

After having etched the substrate 14, the acid solution 16 contains minute particles 17 composed of materials insoluble to the acid solution 16.

The circulation system 40 is comprised of, for instance, a first conduit 19 through which the acid solution 16 is fed into a container 61 of the filter system 20 from the etching bath 10, a second conduit 62 through which the acid solution 16 is fed to the nozzle system 12 from the container 61 of the filter system 20, a first pump 18 arranged in the first conduit 19 for feeding the acid solution 16 to the container 61 of the filter system 20 from the etching bath 10, and a second pump 24 arranged in the second conduit 62 for feeding the acid solution 16 to the nozzle system 12 from the container 61 of the filter system 20.

The fluid-pressure meter 25 is arranged in the second conduit 62 for measuring a pressure of the acid solution 16 in the second conduit 62.

The acid solution 16 accumulated in the etching bath 10 is discharged out of the etching bath 10 by the first pump 18, and then, fed into the container 61 of the filter system 20 through the first conduit 19.

The filter system 20 is comprised of a container 61 temporarily containing the acid solution 16 having been introduced thereinto through the first conduit 19 from the etching bath 10, a rotator 22 which produces vortexes 21 in the acid solution 16 in the container 61, and a particle collector 23 which collects the minute particles 17 precipitating at an inner edge of the container 61.

The rotator 22 is comprised of, for instance, a rotation unit 63 including a plurality of blades (for instance, four blades as illustrated in FIG. 1), and a driver (not illustrated) such as a motor for rotating the rotation unit 63 in a horizontal plane.

There are produced vortexes 21 in the acid solution 16 in the container 61 by rotating the rotation unit 63.

When viewing the filter system 20 from above, the particle collector 23 is situated outside of the rotation unit 63.

For instance, the particle collector 23 is cylindrical and open at an upper end thereof. For instance, a plurality of the particle collectors 23 is disposed at a bottom and at an inner edge of the container 61.

It should be noted that the particle collector 23 may be designed to have a structure other than a structure illustrated in FIG. 1. The particle collector 23 may have any structure, if it can accumulate the minute particles 17 precipitating at an inner edge of the container 61.

For instance, the particle collector 23 may be comprised of an outer wall standing along an inner wall of the container 61, an inner wall which is concentric with the outer wall, but has a smaller diameter than a diameter of the outer wall, and a bottom plate extending between lower ends of the outer and inner walls.

Since vortexes 21 are produced by means of the rotator 22 in the acid solution 16 in the container 61, the minute particles 17 contained in the acid solution 16 move towards an inner edge of the container 61 by centrifugation, that is, move towards out of a rotation radius of the rotator 22, and simultaneously precipitate.

Thus, the minute particles 17 precipitating in the container 61 are collected in the particle collectors 23 arranged at a bottom and along an inner edge of the container 61.

As a result, the clean acid solution 16, that is, the acid solution 16 containing almost no minute particles 17 is accumulated at a center of the container 61.

The thus cleaned acid solution 16 is discharged by the second pump 24 into the nozzle system 12 through the second conduit 62 connecting to the container 61 at a center of a bottom of the container 61.

The acid solution 16 supplied again to the nozzle system 12 is sprayed onto the substrate 14 through the nozzles 13.

The above-mentioned circulation of the acid solution 16 makes it possible to keep supplying the clean acid solution 16 to the substrate 14 through the nozzle system 12.

In place of using the rotator 22, the vortexes 21 may be produced in the acid solution 16 within the container 61 by rotating the container 61 in a horizontal plane. The acid solution 16 can be cleaned by means of the filter system 20 also by rotating the container 61 in a horizontal plane.

In order to enhance a throughput, it is quite effective to etch the substrate at a high etching rate through the use of the acid solution 16.

However, the minute particles 17 insoluble to the acid solution 16 may swiftly deposit on a surface of the substrate 14, in which case, the deposit partially prevents etching of the substrate 14, resulting in significant deterioration of uniformity in etching the substrate 14.

As a solution to such a problem, the etching apparatus 100 in accordance with the first exemplary embodiment is designed to control an intensity of the shower 15 by varying a discharge pressure of the second pump 24, to thereby dynamically remove the deposit composed of the minute particles 17 by means of the shower 15. A discharge pressure of the second pump 24 can be monitored by the fluid-pressure meter 25. Accordingly, it would be possible to control an intensity of the shower 15 applied to a surface of the substrate 14 to a suitable intensity by controlling an output (that is, revolution per minute) of the second pump 24 such that a discharge pressure monitored by the fluid-pressure meter 25 becomes a desired pressure.

To this end, the etching apparatus 100 is designed to include the controller 70 receiving a signal indicative of a pressure of the acid solution 16 from the fluid-pressure meter 25, and controlling an output of the second pump 24 in accordance with the received pressure of the acid solution 16.

For instance, the controller 70 controls a flow rate of the acid solution 16 such that the substrate 14 is etched at an etching rate equal to or higher than 2 micrometers per a minute in the case that the substrate 14 is composed of glass containing silicon dioxide as a principal constituent.

For another instance, the controller 70 controls a flow rate of the acid solution 16 such that the acid solution 16 is sprayed through the nozzles 13 at a pressure in the range of 0.05 MPa and 0.7 MPa both inclusive.

The controller 70 may be designed to control not only an output of the second pump 24, but also an output of the first pump 18 and the circulation pump 27.

In the first exemplary embodiment, the filter system 20 is of a centrifugal type for producing the vortexes 21 in the acid solution 16 as mentioned above. As an alternative, the filter system 20 may be designed to include a mesh filter for filtering the acid solution 16.

In a filter system in which the acid solution 16 is filtered by means of a mesh filter, the acid solution 16 is caused to pass through a mesh filter to capture the minute particles 17 on the mesh filter. Thus, the acid solution 16 is cleaned.

However, if a mesh filter is clogged by the minute particles 17, a flow rate of the acid solution 16 would be deteriorated.

In contrast, the centrifugal type filter system 20 illustrated in FIG. 1 has an advantage that a flow rate of the acid solution 16 is not deteriorated. When the minute particles 17 are accumulated in the particle collector 23 to some degree, the particle collector 23 may be exchanged into a new one, or may be washed.

When the substrate 14 is etched at a high etching rate through the use of the acid solution 16, even if the shower 15 of the acid solution 16 is stopped when etching finishes, the acid solution 16 adhered to a surface of the substrate 14 due to surface tension would continue etching the substrate 14.

Since a volume of the acid solution 16 adhered to a surface of the substrate 14 due to surface tension is random in dependence on a position within the surface, the etching caused by the acid solution 16 adhered to a surface of the substrate 14 due to surface tension deteriorates the uniformity in a thickness of the substrate 14.

In the etching apparatus 100 in accordance with the first exemplary embodiment, the circulation pump 27 is designed to be able to supply water to the nozzle system 12 through the water conduit 26, after the shower 15 of the acid solution 16 was stopped from being supplied through the nozzle system 12. Thus, it is possible to wash a surface of the substrate 14 with the shower 15 of water.

Specifically, the controller 70 stops operation of the first and second pumps 18 and 24 for stopping supplying the shower 15 of the acid solution 16, and immediately thereafter, starts operation of the circulation pump 27 to supply water to the nozzle system 12 through the water conduit 26. Thus, the shower 15 of water washes a surface of the substrate 14.

Consequently, it is possible to prevent the above-mentioned undesired etching of the substrate 14.

In the etching apparatus illustrated in FIG. 1, the substrate 14 vertically stands, and the shower 15 of the acid solution 16 is horizontally sprayed. In contrast, the substrate 14 may be arranged to horizontally lie, and the shower 15 of the acid solution 16 may be vertically upwardly or downwardly sprayed onto the substrate 14.

In the etching apparatus illustrated in FIG. 1, the mover 35 moves the etching 14 relative to the nozzle system 12 during the substrate 14 is being etched. In contrast, the mover 35 may be designed to move the nozzle system 12 relative to the substrate 14 during the substrate 14 is being etched, in which case, it is necessary for the second conduit 62 and the water conduit 26 to have flexible a portion disposed closed to the nozzle system 12 so as not to interfere with the movement of the nozzle system 12.

Since the etching apparatus 100 in accordance with the first exemplary embodiment is designed to include the nozzle system 12 including a plurality of nozzles 13 arranged in a plane which can spray the acid solution 16 containing at least hydrofluoric acid onto the substrate 14 in the shower 15, it would be possible to effectively prevent the minute particles 17 from adhering to a surface of the substrate 14, and accomplish a high etching rate.

Specifically, it would be possible to accomplish an etching rate in the range of 10 to 20 micrometers per a minute both inclusive, ensuring a throughput about twice to about four times higher than a conventional throughput.

Even if a large-size substrate 14 is etched at such a high etching rate, dispersion in an etching rate in a plane of the substrate 14 would be about 5%, ensuring no problems in practical use.

Since a throughput in a glass-etching process is significantly improved, it would be possible to remarkably enhance a fabrication yield of a quite thin liquid crystal display panel, for instance.

Furthermore, since the mover 35 moves at least one of the nozzle system 12 and the substrate 14 relative to the other in a predetermined direction in such a condition that the substrate 14 and the nozzle system 12 face each other, it would be possible to supply the acid solution 16 to the substrate 14 uniformly at a surface thereof, ensuring uniformity in etching the substrate 14.

Furthermore, since the filter system 20 removes the minute particles 17 out of the acid solution 16 before the acid solution 16 having been sprayed onto the substrate 14 is supplied again to the nozzle system 12, it would be possible to always supply the clean acid solution 16, that is, the acid solution containing almost no minute particles 17, onto the substrate 14, ensuring that the substrate 14 is kept uniformly etched.

[Second Exemplary Embodiment]

In an etching apparatus in accordance with the second exemplary embodiment, a relation among a distance D between a surface of the substrate 14 and the nozzle 13, a maximum space Lmax between the nozzles 13 disposed adjacent to each other in the nozzle system 12, and an angle θ by which the acid solution 16 or water sprayed out of the nozzle 13 expands is defined to thereby enhance uniformity in etching the substrate 14 in a plane thereof.

Figure 2:
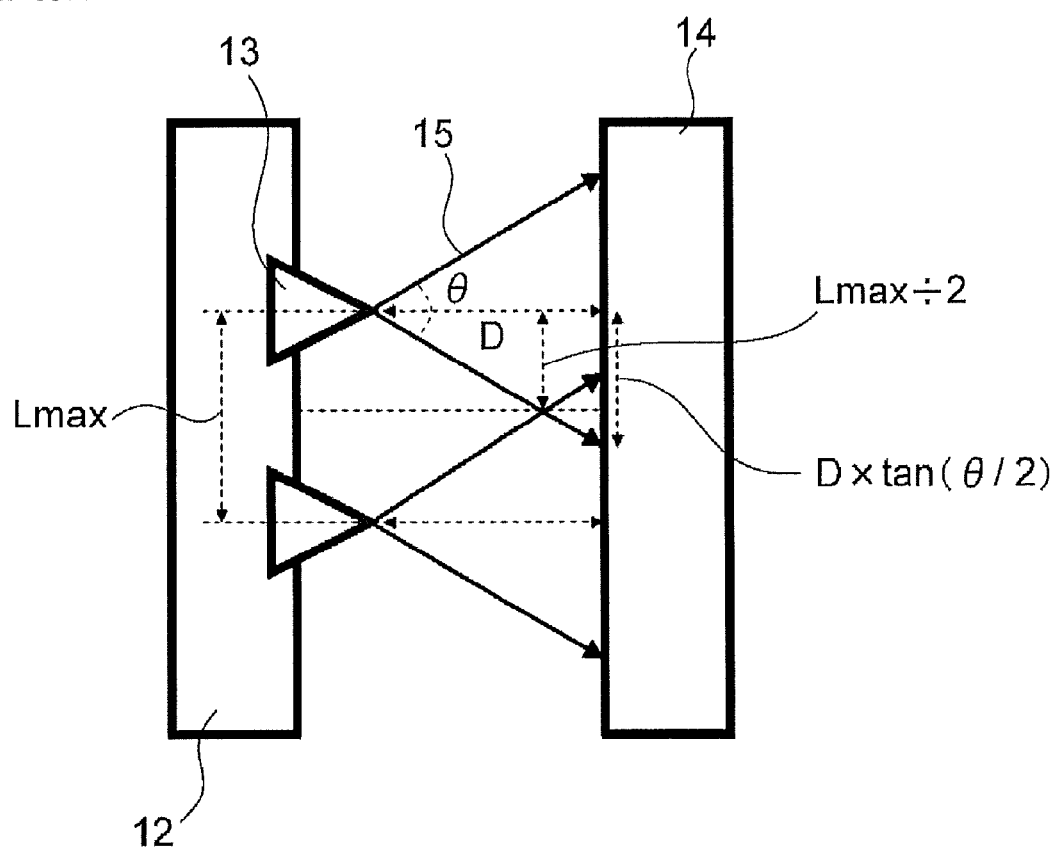
FIG. 2 is an enlarged view of a part of an etching apparatus in accordance with the second exemplary embodiment.

FIG. 2 is an enlarged view of a part of an etching apparatus in accordance with the second exemplary embodiment.

Specifically, FIG. 2 illustrates only the nozzle system 12 and the substrate 14 held by the substrate holder 11 (not illustrated in FIG. 2).

In an etching apparatus in accordance with the second exemplary embodiment, the distance D, the maximum space Lmax, and the angle θ are defined in accordance with the relation (A), as illustrated in FIG. 2.

$$L\max/2 < D \times \tan(\theta/2) \quad \quad (A)$$

By defining the distance D, the maximum space Lmax, and the angle θ in accordance with the relation (A), spraying ranges of the shower 15 of the acid solution 16 adjacent to each other in a surface of the substrate 14 overlaps each other. Thus, the shower 15 of the acid solution 16 is supplied entirely and uniformly onto the substrate 14, ensuring uniformity in etching the substrate 14.

In actually designing the arrangement of the nozzles 13, it is preferable that a space between the nozzles 13 disposed adjacent to each other is constant, in which case, the maximum space Lmax is constant, that is, is equal to a constant L.

It should be noted that it is not necessary to design a space between adjacent nozzles 13 to be constant. For instance, a density at which the nozzles 13 are arranged may be arbitrarily determined. For instance, a density at which the nozzles 13 are arranged for covering a marginal area of the substrate 14 may be lower than a density at which the nozzles 13 are arranged for covering a central area of the substrate 14, in which case, the distance D, the maximum space Lmax, and the angle δ are defined so as to satisfy the relation (A).

The etching apparatus in accordance with the second exemplary embodiment is identical in structure to the etching apparatus 100 in accordance with the first exemplary embodiment except that the distance D, the maximum space Lmax, and the angle θ are defined in accordance with the relation (A).

In the etching apparatus in accordance with the second exemplary embodiment, since the distance D, the maximum space Lmax, and the angle θ are defined in accordance with the relation (A), it would be possible to enhance etching uniformity in a plane of the substrate 14.

[Third Exemplary Embodiment]

In an etching apparatus in accordance with the third exemplary embodiment, a relation between a maximum space Lmax between the nozzles 13 disposed adjacent to each other in the nozzle system 13, and a minimum length Mmin by which at least one of the nozzle system 12 and the substrate 14 is moved by the mover 35 is defined to thereby enhance uniformity in etching the substrate 14 in a plane thereof.

Figure 3:
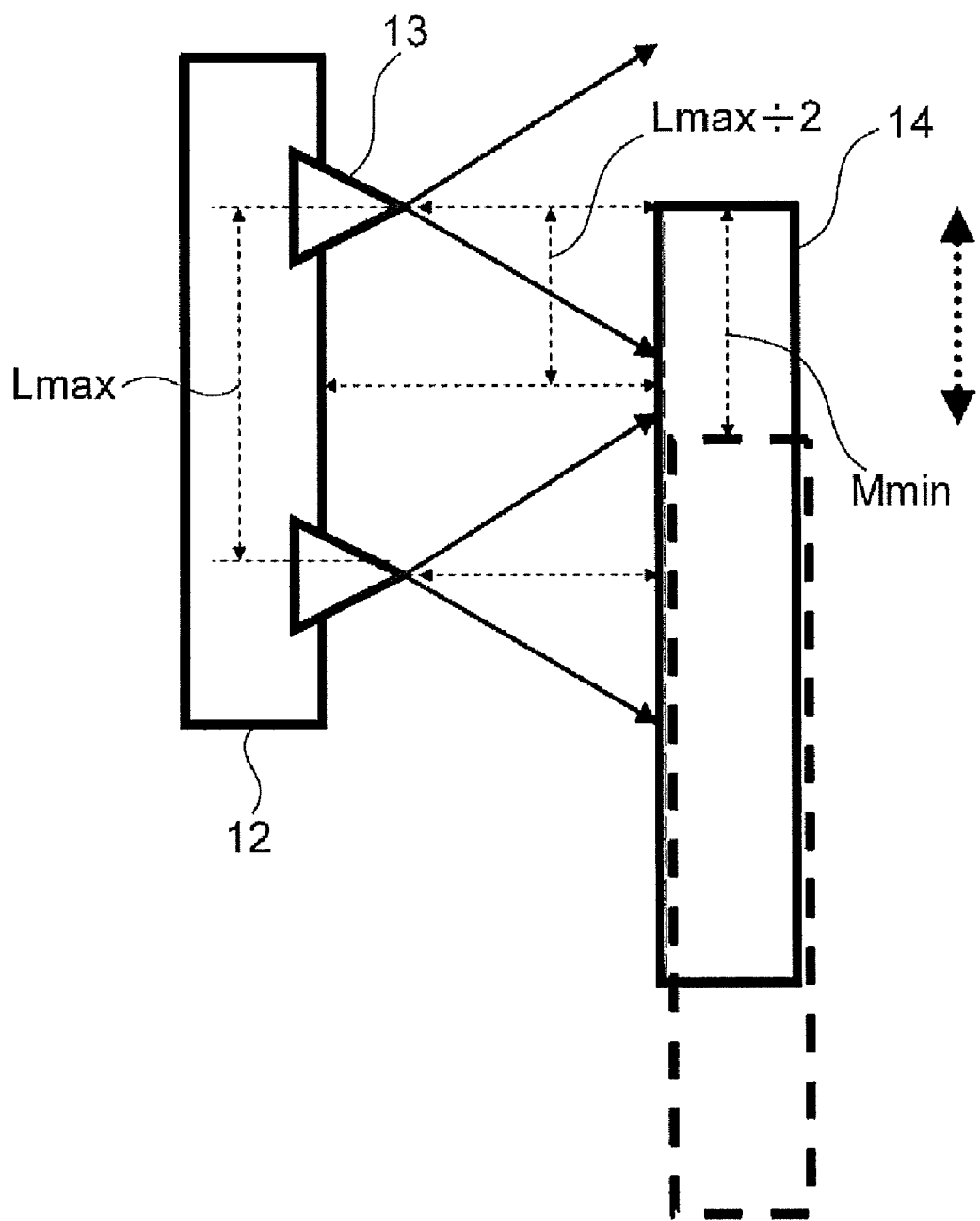
FIG. 3 is an enlarged view of a part of an etching apparatus in accordance with the third exemplary embodiment.

FIG. 3 is an enlarged view of a part of an etching apparatus in accordance with the third exemplary embodiment.

Specifically, FIG. 3 illustrates only the nozzle system 12 and the substrate 14 held by the substrate holder 11 (not illustrated in FIG. 3).

In an etching apparatus in accordance with the third exemplary embodiment, the maximum space Lmax and the minimum length Mmin are defined in accordance with the relation (B), as illustrated in FIG. 3.

$$L\max/2 < M\min \quad (B)$$

By defining the maximum space Lmax and the minimum length Mmin in accordance with the relation (B), even if the above-mentioned relation (A) is not satisfied, spraying ranges of the shower 15 of the acid solution 16 adjacent to each other in a surface of the substrate 14 overlaps each other. Thus, the shower 15 of the acid solution 16 is supplied entirely and uniformly onto the substrate 14, ensuring uniformity in etching the substrate 14.

In actually designing the arrangement of the nozzles 13, it is preferable that a space between the nozzles 13 disposed adjacent to each other is constant, in which case, the maximum space Lmax is constant, that is, is equal to a constant L.

It should be noted that it is not necessary to design a space between adjacent nozzles 13 to be constant. For instance, a density at which the nozzles 13 are arranged may be arbitrarily determined. For instance, a density at which the nozzles 13 are arranged for covering a marginal area of the substrate 14 may be lower than a density at which the nozzles 13 are arranged for covering a central area of the substrate 14, in which case, the maximum space Lmax and the minimum length Mmin are defined so as to satisfy the relation (B).

The etching apparatus in accordance with the third exemplary embodiment is identical in structure to the etching apparatus 100 in accordance with the first exemplary embodiment except that the maximum space Lmax and the minimum length Mmin are defined in accordance with the relation (B).

In the etching apparatus in accordance with the third exemplary embodiment, since the maximum space Lmax and the minimum length Mmin are defined in accordance with the relation (B), it would be possible to enhance etching uniformity in a plane of the substrate 14.

The etching apparatus in accordance with the third exemplary embodiment may be designed to satisfy the above-mentioned relation (A) having been explained in the second exemplary embodiment.

It is preferable in the above-mentioned first to third exemplary embodiments to control a discharge amount of the acid solution 16 sprayed out of the nozzles 13 in order to effectively remove the minute particles 17 adhered to a surface of the substrate 14 during being etched. To this end, it is preferable to control each of the nozzles 13 to discharge the acid solution 16 by 0.1 liter or more per a minute. If a discharge amount of the acid solution 16 to be discharged out of the nozzle 13 is smaller than 0.1 liter, dynamic removal action acting on the substrate 14 might be too weak with the result of failure in preventing the minute particles 17 from adhering the substrate 14.

Hereinbelow are explained specific examples of an etching apparatus in accordance with the present invention.

EXAMPLE 1

Example 1 is explained hereinbelow with reference to FIG. 1.

As the substrate 14, there was used a glass substrate on which a polysilicon thin film transistor (thin film transistor array) had been already fabricated. The glass substrate had a size of 370 mm×470 mm, and a thickness of 0.7 mm.

A PET film as a protection film was adhered by means of an adhesive onto a surface of the glass substrate on which the polysilicon thin film transistor had been already fabricated.

The glass substrate was set to be held by the substrate holder 11.

There was used a mixture of hydrofluoric acid, hydrochloric acid, and water as the acid solution 16.

The nozzles 13 were arranged in a matrix in the nozzle system 12 such that a space between adjacent ones was constant, specifically, the nozzles 13 were equally spaced to one another by a distance of 40 mm. The nozzle system 12 had a size of 500 mm×600 mm.

A distance between summits of the nozzles 13 and a surface of the substrate 14 was set equal to 40 mm.

Varying a discharge pressure of the shower 15 of the acid solution 16 in the range of 0.1 MPa to 0.3 MPa, the glass substrate was etched through a lower surface thereof, that is, a surface opposite to a surface on which the polysilicon thin film transistor had been already fabricated.

An angle by which the shower 15 expands was about 60 degrees.

During the substrate 14 is etched, the substrate 14 was moved by the mover 35 both vertically and horizontally at a frequency in the range of 0.3 to 2 Hz by a movement length of 40 mm.

The figures mentioned above satisfy the above-mentioned relations (A) and (B).

After the etching of the glass substrate has been finished, the shower 15 of the acid solution 16 was ceased, and then, in five seconds, water was sprayed onto the substrate 14 through the nozzles 13. Thus, the substrate 14 was washed with the water shower 15.

A glass substrate generally used for fabrication of a polysilicon thin film transistor and an amorphous silicon thin film transistor contains silicon dioxide (or silicon oxide) as a principal constituent, and additionally contains metal oxide such as barium oxide, calcium oxide, strontium oxide and aluminum oxide at about 5 to about 25%.

During the glass substrate is being etched, there are produced fluorides of the above-mentioned metals. The thus produced fluorides have quite small solubility to acid or water.

As a result, the fluorides of the metals remain as the minute particles 17 in the acid solution 16 and/or on a surface of the substrate 14.

If the minute particles 17 are adhered to a surface of the substrate 14, the minute particles 17 would partially prevent the substrate 14 from being etched, resulting in deterioration in etching uniformity at a surface of the substrate 14. The related art was accompanied with such a problem.

The etching apparatus 100 illustrated in FIG. 1 accomplished quite high etching uniformity by dynamically remove the minute particles 17 off a surface of the substrate 14 by virtue of a pressure of the shower 15 of the acid solution 16.

Furthermore, the minute particles 17 composed of the above-mentioned fluorides of the metals were effectively caught due to centrifugation and/or precipitation in the particle collectors 23 arranged in the vicinity of or along an inner wall of the container 61 of the filter system 20.

Figure 4:
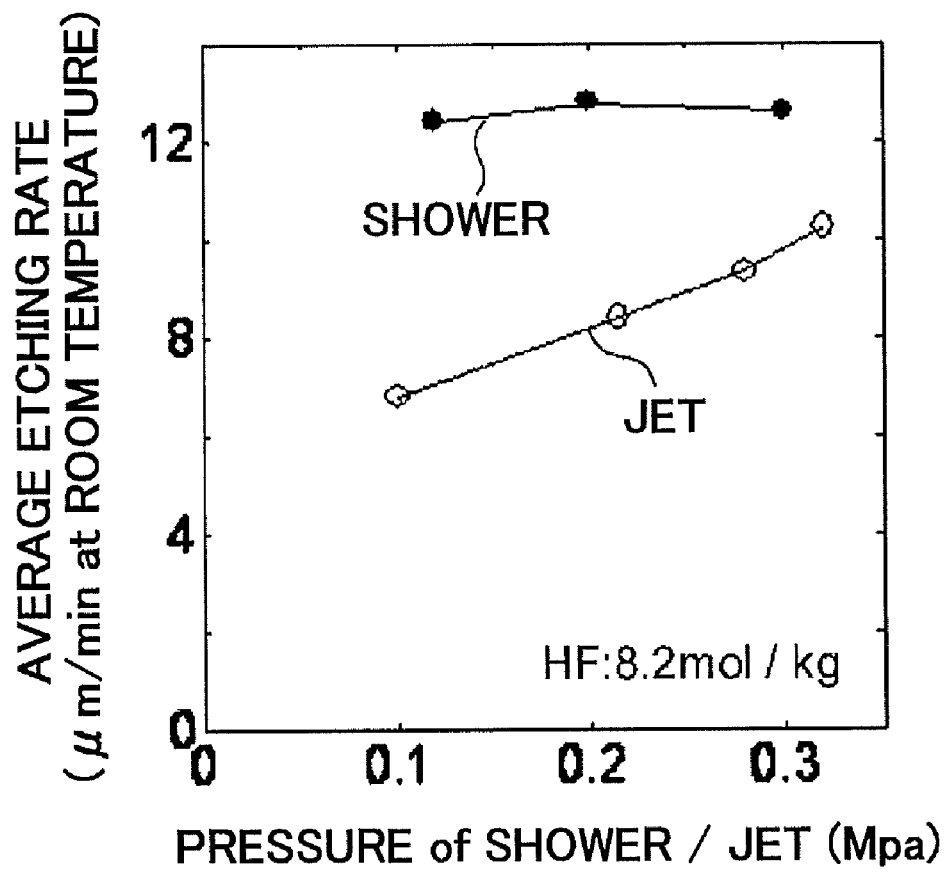
FIG. 4 is a graph showing a relation between an average etching rate at which the glass substrate was etched, and a pressure of shower in Example 1.

FIG. 4 is a graph showing a relation between an average etching rate at which the glass substrate was etched, and a pressure of the shower 15.

In FIG. 4, the acid solution 16 contained hydrofluoric acid at 8.2 mol/kg.

The average etching rate illustrated in FIG. 4 was calculated by measuring etching rates at sixteen points in the glass substrate.

For comparison, FIG. 4 also shows a relation between an average etching rate and a pressure of jet used in conventional etching of a glass substrate.

In the conventional etching of a glass substrate, a glass substrate was entirely immersed into acid solution, and jet was supplied onto a surface of the glass substrate in the acid solution.

As is obvious in FIG. 4, the shower 15 in Example 1 makes it possible to etch a glass substrate at an etching rate higher than an etching rate accomplished in the conventional jet etching, even if the acid solution contains hydrofluoric acid at the same concentration.

The high-rate etching accomplished in Example 1 enhances a fabrication yield.

In addition, an etching rate remains almost constant in a broad range of a pressure of the shower in the shower etching in Example 1.

This indicates that Example 1 has a wide process window relative to a pressure. That is, there is almost no fluctuation in an etching rate, even if there is fluctuation in a pressure, ensuring enhancement in a fabrication yield.

Figure 5:
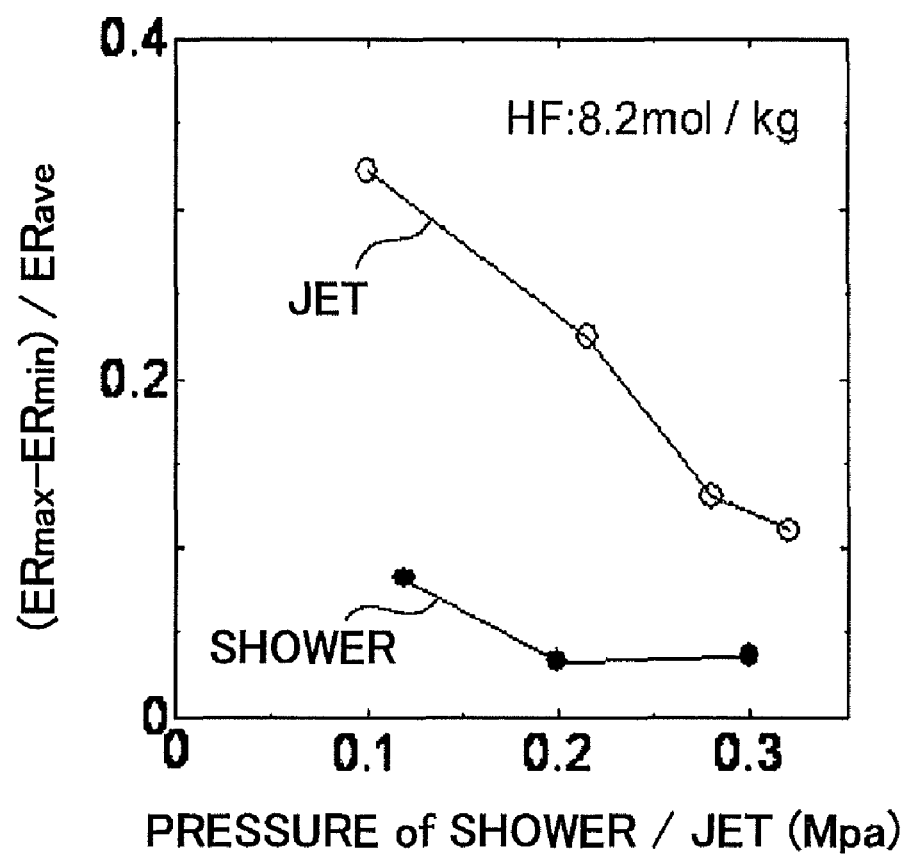
FIG. 5 is a graph showing a relation between the uniformity of an etching rate and a shower/jet pressure in Example 1.

FIG. 5 is a graph showing a relation between the uniformity of an etching rate and a shower/jet pressure.

The uniformity U of an etching rate is defined as follows:

$$U=(ER\text{max}-ER\text{min})/ER\text{ave}$$

wherein ERmax indicates a maximum etching rate among etching rates measured at the above-mentioned sixteen points, ERmin indicates a minimum etching rate among etching rates measured at the above-mentioned sixteen points, and ERave indicates an average etching rate of etching rates measured at the above-mentioned sixteen points.

As is obvious in FIG. 5, the shower etching in Example 1 accomplishes the etching rate uniformity of about 5%. This means that a glass substrate is quite uniformly etched.

In the conventional jet etching, the etching rate uniformity is improved by virtue of an increase in a jet pressure, but the etching rate uniformity is over 10%, even when a jet pressure is high, specifically, a jet pressure is 0.3 MPa.

The average etching rate observed when a jet pressure is 0.3 MPa is about 10 micrometers per a minute in view of FIG. 4. Accordingly, it is estimated that a maximum etching rate is about 10.5 micrometers per a minute, and a minimum etching rate is about 9.5 micrometers per a minute.

If a glass substrate having a thickness of 0.7 mm is etched for sixty minutes at an etching rate having such dispersion, the glass substrate would have a thinnest portion having a thickness of 70 micrometers and a thickest portion having a thickness of 130 micrometers. That is, the glass substrate has a significant thickness profile.

Accordingly, it is necessary to ensure the etching rate uniformity to be about 5% in order to uniformly etch a glass substrate to a thickness of about 100 micrometers. Thus, Example 1 provides a great advantage for etching a glass substrate.

Figure 6:
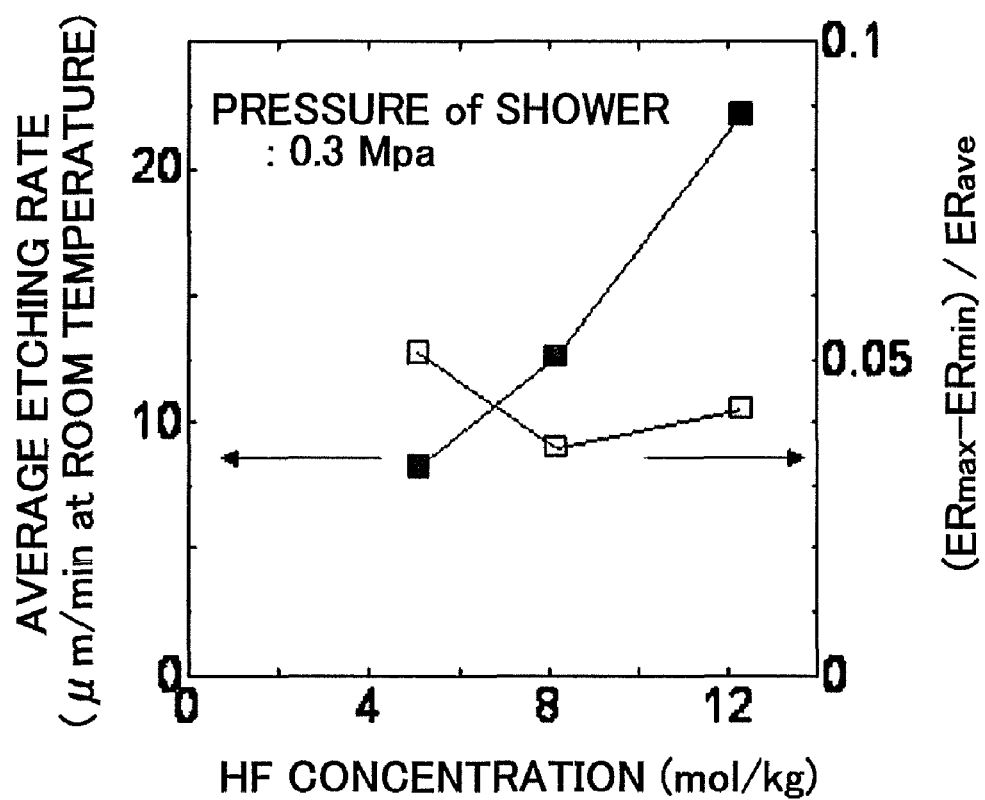
FIG. 6 is a graph showing a relation among an average etching rate, the etching rate uniformity, and a concentration of hydrofluoric acid, with respect to the shower etching in Example 1.

FIG. 6 is a graph showing a relation among an average etching rate, the etching rate uniformity, and a concentration of hydrofluoric acid, with respect to the shower etching in Example 1.

As is obvious in FIG. 6, an etching rate increases in proportion with a concentration of hydrofluoric acid, and the etching rate uniformity remains almost constant regardless of a concentration of hydrofluoric acid. Specifically, the etching rate uniformity remains equal to about 5%.

As is obvious in view of FIGS. 4 to 6, the etching apparatus in accordance with Example 1 makes it possible to accomplish a high etching rate and high etching-rate uniformity in etching a glass substrate, both of which were not accomplished in the related art, with a broad process window by carrying out the shower etching.

The glass substrate was thinned to a thickness of 80 micrometers by the shower etching in Example 1. Then, a resin film having a thickness of 100 micrometers was attached to an etched surface of the glass substrate. Then, the thin film transistor array was transferred onto the resin substrate by peeling off the protection PET film.

A total thickness of the resultant thin film transistor array and the resin substrate was about 200 micrometers, and the resultant thin film transistor array formed on the resin substrate has flexibility.

Figure 7:
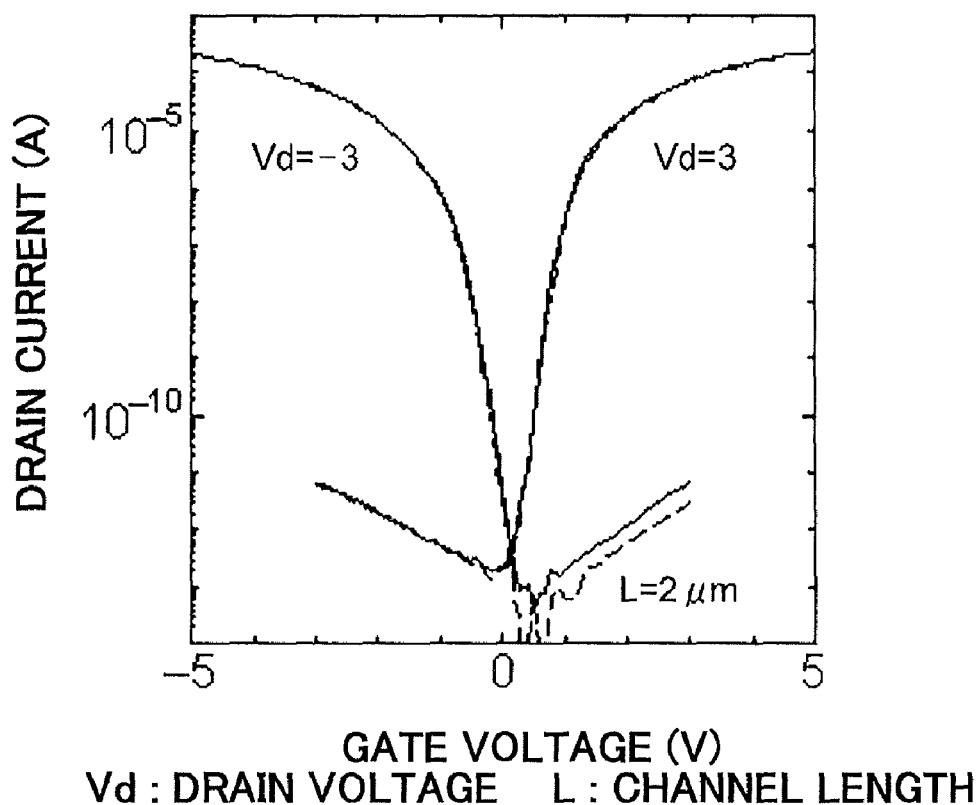
FIG. 7 is a graph showing a relation between a gate voltage and a drain current in a thin film transistor before the thin film transistor is transferred onto a resin substrate, and a relation between a gate voltage and a drain current in the thin film transistor after the thin film transistor was transferred onto a resin substrate, in Example 1.

FIG. 7 is a graph showing a relation between a gate voltage and a drain current in a thin film transistor before the thin film transistor is transferred onto a resin substrate, and a relation between a gate voltage and a drain current in the thin film transistor after the thin film transistor was transferred onto a resin substrate.

The relation between a gate voltage and a drain current in a thin film transistor "before" the thin film transistor is transferred onto a resin substrate indicates a relation between a gate voltage and a drain current in a thin film transistor formed on the glass substrate having a thickness of 0.7 mm. In FIG. 7, the solid line indicates the relation observed before the thin film transistor is transferred onto a resin substrate, and the broken line indicates the relation observed after the thin film transistor was transferred onto a resin substrate.

As is obvious in FIG. 7, the relation between a gate voltage and a drain current remains almost the same during "before" the thin film transistor is transferred onto a resin substrate to "after" the thin film transistor was transferred onto a resin substrate. This means that the shower etching in Example 1 does not damage the thin film transistor.

EXAMPLE 2

Example 2 is explained hereinbelow with reference to FIG. 8.

Figure 8:
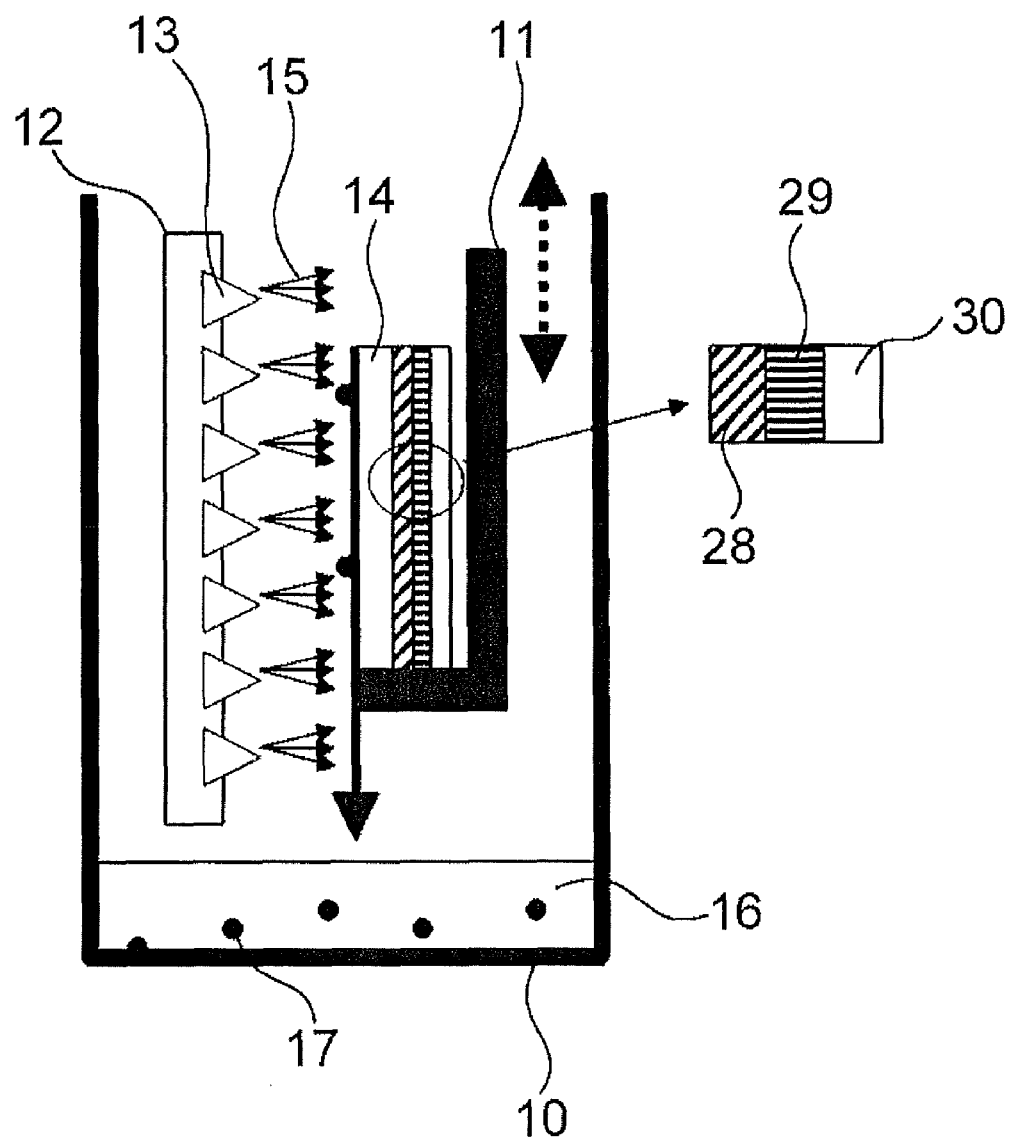
FIG. 8 illustrates an etching bath, a nozzle system, a substrate, and a substrate holder in an etching apparatus in accordance with Example 2.

FIG. 8 illustrates only the etching bath 10, the nozzle system 12, the substrate 14, and the substrate holder 11.

As the substrate 14, there was used a glass substrate on which a polysilicon thin film transistor had been already fabricated. The glass substrate had a size of 300 mm×350 mm, and a thickness of 0.7 mm.

On the glass substrate was formed a tantalum oxide film as an etching stopper film 28. Then, on the etching stopper film 28 was formed a thin film transistor array as a thin film device 29, and thereafter, a protection film 30 was attached onto the thin film device 29.

The glass substrate was etched in the same way as Example 1. When the glass substrate was thinned to about 50 micrometers, an etchant comprised of the acid solution 16 containing acid at a first concentration was exchanged to an etchant comprised of the acid solution 16 containing acid at a second concentration lower than the first concentration. The glass substrate having a thickness of about 50 micrometers was all etched with the etchant comprised of the acid solution 16 containing acid at the second concentration.

That is, the glass substrate was first etched at a relatively high etching rate through the use of an etchant comprised of the acid solution 16 containing acid at a relatively high concentration, and the rest of the glass substrate was etched for removal at a relatively low etching rate through the use of an etchant comprised of the acid solution 16 containing acid at a relatively low concentration.

The reason why the glass substrate was etched in such two steps is for lowering damages to the etching stopper film 28.

Though the etching stopper film 28 has a function of stopping etching, the etching stopper film 28 is not always completely stable to the acid solution 16. In other words, even the etching stopper film 28 allows a substrate to be etched to some degree.

If the acid solution 16 contains acid at a high concentration, the etching stopper film 28 is also etched, resulting in that the etching stopper film 28 would lose a function of stopping etching. In order to prevent the etching stopper film 28 from losing a function of stopping etching, the glass substrate was etched in the two steps.

The etching stopper film 28 may contain at least one of gold, platinum, silver, copper, lead, tungsten, molybdenum, tantalum, chromium, oxide of these metals, fluoride of these metals, nitride of these metals, and chloride of these metals. As an alternative, the etching stopper film 28 may be designed to have a multi-layered structure comprised of films containing at least one of gold, platinum, silver, copper, lead, tungsten, molybdenum, tantalum, chromium, oxide of these metals, fluoride of these metals, nitride of these metals, and chloride of these metals.

After the glass substrate was etched for removal, a resin film having a thickness of 100 micrometers was attached to an etched surface of the glass substrate. Then, by peeling off the protection film, the thin film transistor array was transferred onto the resin substrate.

Thus, there was fabricated a thin film transistor array on a flexible substrate. Similarly to Example 1 (see FIG. 7), there was almost no difference in electrical characteristics of the thin film transistor array between before being transferred onto a resin substrate and after having been transferred onto a resin substrate.

EXAMPLE 3

Example 3 is explained hereinbelow with reference to FIG. 9.

There was fabricated a thin film transistor array as a thin film device 32 on a first glass substrate 31, and further, there was fabricated a color filter as a thin film device 34 on a second glass substrate 33. Then, the first and second glass substrates 31 and 33 were adhered to each other such that the thin film devices 32 and 34 faced each other. Liquid crystal was introduced into a gap formed between the first and second glass substrates 31 and 33.

Figure 9:
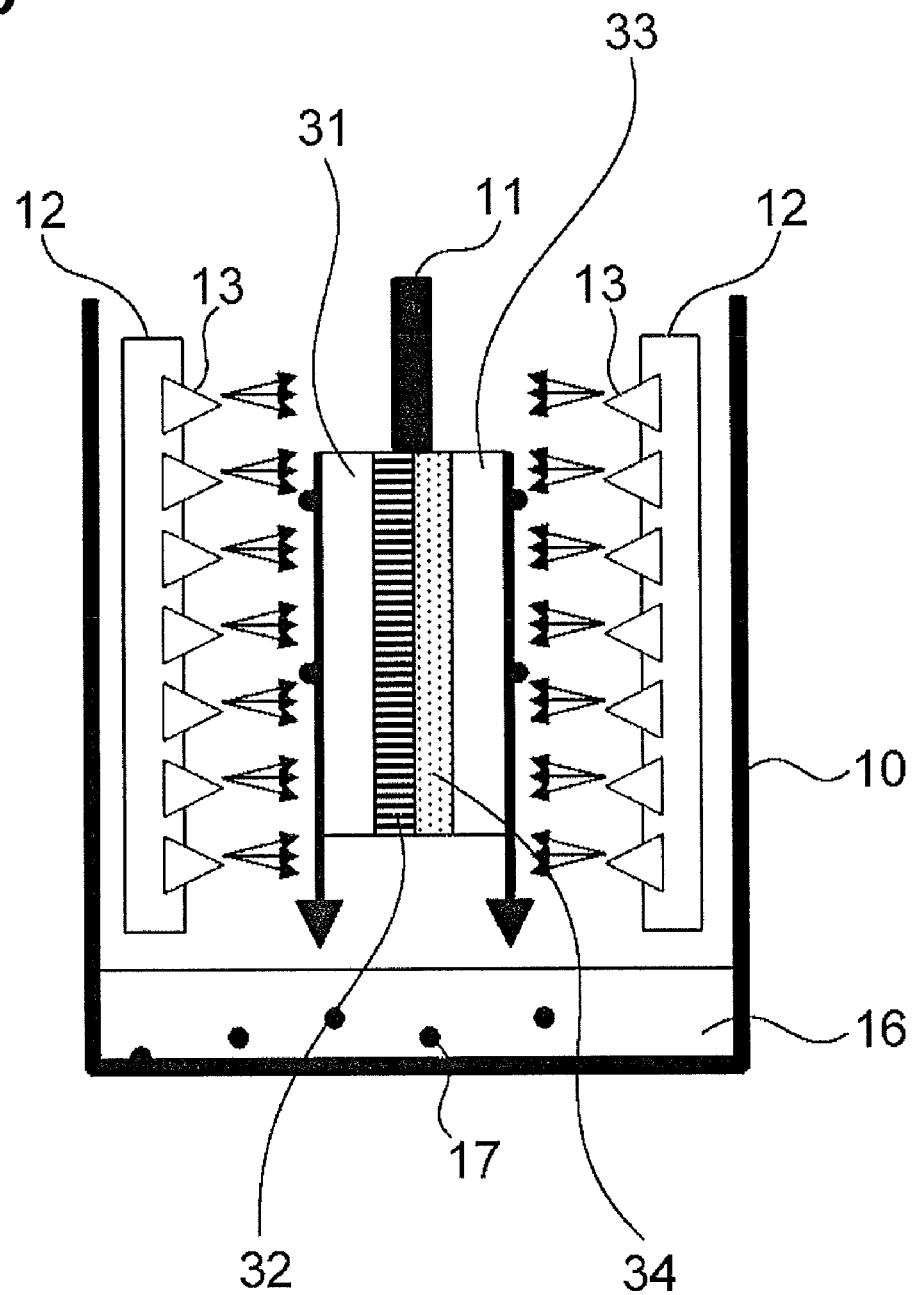
FIG. 9 illustrates principal parts of an etching apparatus in accordance with Example 3.

Then, the first and second glass substrates 31 and 33 were etched through the use of an etching apparatus having such a structure as illustrated in FIG. 9.

FIG. 9 illustrates principal parts of an etching apparatus including an etching bath 10, and a pair of nozzle systems 12 facing each other in the etching bath 10. One of the nozzle systems 12 is used for etching the first glass substrate 31, and the other is used for etching the second glass substrate 33.

In Example 3, both of the first and second glass substrates 31 and 33 were etched into a thickness of 200 micrometers in the same way as Example 1.

Thereafter, a polarizing film was attached to each of etched surfaces of the first and second glass substrates 31 and 33. Thus, there was fabricated a quite thin liquid crystal display device.

In Example 3, the glass substrate 33 on which the thin film device 34 was fabricated may be replaced with a resin substrate (that is, a flexible substrate) on which a thin film device has been already fabricated.

For instance, a glass substrate on which a thin film transistor array is fabricated and a resin substrate on which a color filter is fabricated may be adhered to each other, and then, only the glass substrate may be etched.

The etching apparatus in accordance with the above-mentioned first to third exemplary embodiments and Examples 1 to 3 may be used for lightening, thinning or providing flexibility to a flat panel display in a liquid crystal display device or an organic electroluminescence (EL) display device. As an alternative, the etching apparatus may be used generally for thinning a glass plate at a high rate.

As mentioned earlier, it is preferable in the exemplary embodiments that the mover moves the substrate relative to the nozzle system.

It is preferable in the exemplary embodiments that Lmax/2 is smaller than D×tan(θ/2), that is, $$L\max/2 < D \times \tan(\theta/2)$$

wherein Lmax indicates a maximum space between adjacent nozzles in the nozzle system, D indicates a distance between the substrate and the nozzle, and θ indicates an angle by which the acid solution sprayed out of the nozzle expands.

It is preferable in the exemplary embodiments that Lmax/2 is smaller than Mmin, that is, $$L\max/2 < M\min$$

wherein Lmax indicates a maximum space between adjacent nozzles in the nozzle system, and Mmin indicates a minimum length by which the at least one of the nozzle system and the substrate is moved by the mover.

It is preferable in the exemplary embodiments that the nozzle sprays the acid solution in a volume greater than 0.1 liter per a minute.

It is preferable in the exemplary embodiments that the filter system includes a container which temporarily contains the acid solution before the acid solution is supplied to the nozzle system after the acid solution was sprayed onto the substrate, a rotator which produces vortex in the acid solution in the container, and a particle collector which collects particles precipitating at an inner edge of the container.

It is preferable in the exemplary embodiments that the nozzle system alternately sprays the acid solution and water onto the substrate.

The etching apparatus may further include a controller which controls a flow rate of the acid solution such that the substrate is etched at an etching rate equal to or higher than 2 micrometers per a minute, when the substrate is composed of glass containing silicon dioxide as a principal constituent.

The etching apparatus may further include a controller which controls a flow rate of the acid solution such that the acid solution is sprayed through the nozzle at a pressure in the range of 0.05 MPa and 0.7 MPa both inclusive.

It is preferable in the exemplary embodiments that an electronic device is fabricated on a surface of the glass substrate, the surface being opposite to a surface to be etched, in which case, it is preferable that the electronic device is comprised of a thin film transistor (TFT).

It is preferable in the exemplary embodiments that the acid solution is comprised of a combination of hydrofluoric acid and at least one of hydrochloric acid and nitric acid.

It is preferable in the exemplary embodiments that the acid solution is sprayed through the nozzle at a pressure in the range of 0.05 MPa and 0.7 MPa both inclusive.

It is preferable in the exemplary embodiments that the glass substrate is rectangular, having a side equal to or longer than 250 mm.

The method of fabricating a thin-glass substrate may further include stopping spraying the acid solution onto the substrate through the nozzle, and spraying water onto the substrate through the nozzle to wash the substrate.

In the method of fabricating a TFT array substrate, it is preferable that the etching stopper film contains at least one of gold, platinum, silver, copper, lead, tungsten, molybdenum, tantalum, chromium, oxide of these metals, fluoride of these metals, nitride of these metals, and chloride of these metals.

It is preferable in the exemplary embodiments that a thin film transistor array is fabricated on one of the glass substrates, and a color filter is fabricated on the other.

It is preferable in the exemplary embodiments that a thin film transistor array is fabricated on the glass substrate, and a color filter is fabricated on the flexible substrate.

The exemplary advantages obtained by the above-mentioned exemplary embodiments are described hereinbelow.

In accordance with the above-mentioned exemplary embodiments, a glass substrate is not immersed into hydrofluoric acid solution, but hydrofluoric acid solution is sprayed like shower onto a glass substrate to thereby etch the glass substrate. Thus, it is possible to effectively prevent minute particles from attaching a surface of a glass substrate, and further, to accomplish a high etching rate.

The mover moves at least one of a nozzle system and a substrate relative to the other in a predetermined direction in such a condition that the substrate and the nozzle system face each other. This ensures that the substrate is uniformly etched.

Before acid solution having been sprayed onto a substrate is supplied again to the nozzle system, minute particles are removed out of the acid solution by means of the filter system. Thus, clean acid solution is always supplied to the nozzle system. Hence, it is possible to keep a substrate uniformly etched.

While the present invention has been described in connection with certain exemplary embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

This application is based upon and claims the benefit of priority from Japanese Patent Application No. 2006-184351 filed on Jul. 4, 2006, the entire disclosure of which, including specification, claims, drawings and summary, is incorporated herein by reference in its entirety.

What is claimed is:

1. A method of fabricating a thin-glass substrate, comprising:
    preparing an apparatus for etching a substrate; and
    etching a glass substrate containing silicon dioxide as a principal constituent at an etching rate equal to or higher than 2 micrometers per a minute by means of said apparatus,
    said apparatus comprising:
    (a) a nozzle system including at least one nozzle through which acid solution containing at least hydrofluoric acid is sprayed onto said substrate;
    (b) a mover which moves at least one of said nozzle system and said substrate relative to the other in a predetermined direction in such a condition that said substrate and said nozzle system face each other;
    (c) a filter system which filters off particles out of said acid solution having been sprayed onto said substrate, said filter system including:
        a container which temporarily contains said acid solution before said acid solution is supplied to said nozzle mechanism after said acid solution was sprayed onto said substrate;
        a rotator which produces vortex in said acid solution in said container; and
        a particle collector which collects particles precipitating at an inner edge of said container; and
    (d) a circulation system which circulates said acid solution having been sprayed onto said substrate, to said filter system, and further, to said nozzle system from said filter system.

2. The method as set forth in claim 1, wherein an electronic device is fabricated on a surface of said glass substrate, said surface being opposite to a surface to be etched.

3. The method as set forth in claim 2, wherein said electronic device is comprised of a thin film transistor (TFT).

4. The method as set forth in claim 1, wherein said acid solution is comprised of a combination of hydrofluoric acid and at least one of hydrochloric acid and nitric acid.

5. The method as set forth in claim 1, wherein said acid solution is sprayed through said nozzle at a pressure in the range of 0.05 MPa and 0.7 MPa both inclusive.

6. The method as set forth in claim 1, wherein said glass substrate is rectangular, having a side equal to or longer than 250 mm.

7. The method as set forth in claim 1, further comprising:
    stopping spraying said acid solution onto said substrate through said nozzle; and
    spraying water onto said substrate through said nozzle to wash said substrate.

8. A method of fabricating a device, comprising:
    (A) fabricating a device by adhering a glass substrate containing silicon dioxide as a principal constituent and a flexible substrate to each other, a thin film device has been already fabricated on each of upper surfaces of said glass substrate and said flexible substrate, said glass substrate and said flexible substrate being adhered to each other such that said upper surfaces face each other; and
    (B) etching only said glass substrate through lower surfaces thereof,
    said step (B) comprising:
    preparing an apparatus for etching a substrate; and
    etching said glass substrate at an etching rate equal to or higher than 2 micrometers per a minute by means of said apparatus,
    said apparatus comprising:
    (a) a nozzle system including at least one nozzle through which acid solution containing at least hydrofluoric acid is sprayed onto said substrate;
    (b) a mover which moves at least one of said nozzle system and said substrate relative to the other in a predetermined direction in such a condition that said substrate and said nozzle system face each other;
    (c) a filter system which filters off particles out of said acid solution having been sprayed onto said substrate, said filter system including:
    a container which temporarily contains said acid solution before said acid solution is supplied to said nozzle mechanism after said acid solution was sprayed onto said substrate;
    a rotator which produces vortex in said acid solution in said container; and a particle collector which collects particles precipitating at an inner edge of said container; and (d) a circulation system which circulates said acid solution having been sprayed onto said substrate, to said filter system, and further, to said nozzle system from said filter system.

9. The method as set forth in claim 8, wherein a thin film transistor array is fabricated on said glass substrate, and a color filter is fabricated on said flexible substrate.

* * * * *